(12) United States Patent
Mukherjee et al.

(10) Patent No.: US 11,594,409 B2
(45) Date of Patent: Feb. 28, 2023

(54) SYSTEMS AND METHODS FOR DEPOSITING LOW-K DIELECTRIC FILMS

(71) Applicant: Applied Materials, Inc., Santa Clara, CA (US)

(72) Inventors: Shaunak Mukherjee, San Jose, CA (US); Kang Sub Yim, Palo Alto, CA (US); Deenesh Padhi, Sunnyvale, CA (US); Abhijit A. Kangude, Sunnyvale, CA (US); Rahul Rajeev, Foster City, CA (US); Shubham Chowdhuri, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/902,888

(22) Filed: Jun. 16, 2020

(65) Prior Publication Data
US 2021/0272800 A1    Sep. 2, 2021

Related U.S. Application Data

(60) Provisional application No. 62/983,305, filed on Feb. 28, 2020.

(51) Int. Cl.
    *H01L 21/02*    (2006.01)
(52) U.S. Cl.
    CPC .... *H01L 21/02126* (2013.01); *H01L 21/0228* (2013.01)
(58) Field of Classification Search
    None
    See application file for complete search history.

(56) References Cited

U.S. PATENT DOCUMENTS

| 2003/0049460 A1* | 3/2003 | O'Neill | H01L 21/02216 |
| | | | 428/428 |
| 2005/0194619 A1* | 9/2005 | Edelstein | H01L 31/103 |
| | | | 257/E31.057 |

(Continued)

FOREIGN PATENT DOCUMENTS

| JP | 2009-510768 A | 3/2009 |
| KR | 2017-0004942 A | 1/2017 |
| WO | 2010-065410 A1 | 6/2010 |

OTHER PUBLICATIONS

International Search Report and Written Opinion dated Jun. 8, 2021 in International Patent Application No. PCT/US2021/018282, 8 pages.

(Continued)

*Primary Examiner* — Asok K Sarkar
(74) *Attorney, Agent, or Firm* — Kilpatrick Townsend & Stockton LLP

(57) ABSTRACT

Exemplary methods of forming a silicon-and-carbon-containing material may include flowing a silicon-and-carbon-containing precursor into a processing region of a semiconductor processing chamber. A substrate may be housed within the processing region of the semiconductor processing chamber. The methods may include forming a plasma within the processing region of the silicon-and-carbon-containing precursor. The plasma may be formed at a frequency above 15 MHz. The methods may include depositing a silicon-and-carbon-containing material on the substrate. The silicon-and-carbon-containing material as-deposited may be characterized by a dielectric constant below or about 3.0.

12 Claims, 3 Drawing Sheets

(56) References Cited

U.S. PATENT DOCUMENTS

2006/0079099 A1    4/2006   Nguyen et al.
2010/0052115 A1    3/2010   McAndrew et al.

OTHER PUBLICATIONS

International Preliminary Report on Patentability dated Sep. 9, 2022 in International Patent Application No. PCT/US2021/018282, 7 pages.

* cited by examiner

SYSTEMS AND METHODS FOR DEPOSITING LOW-K DIELECTRIC FILMS

CROSS-REFERENCES TO RELATED APPLICATIONS

This application claims the benefit of U.S. Provisional Patent Application No. 62/983,305, filed Feb. 28, 2020, the contents of which are hereby incorporated by reference in their entirety for all purposes.

TECHNICAL FIELD

The present technology relates to deposition processes and chambers. More specifically, the present technology relates to methods of producing low-k films that may not utilize UV treatments.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Exemplary methods of forming a silicon-and-carbon-containing material may include flowing a silicon-and-carbon-containing precursor into a processing region of a semiconductor processing chamber. A substrate may be housed within the processing region of the semiconductor processing chamber. The methods may include forming a plasma within the processing region of the silicon-and-carbon-containing precursor. The plasma may be formed at a frequency above 15 MHz. The methods may include depositing a silicon-and-carbon-containing material on the substrate. The silicon-and-carbon-containing material as-deposited may be characterized by a dielectric constant below or about 3.0.

In some embodiments, the silicon-and-carbon-containing precursor may include oxygen. The silicon-and-carbon-containing precursor may be characterized by a carbon-to-silicon ratio greater than 1. The plasma may be formed at a frequency above or about 27 MHz. The silicon-and-carbon-containing material as-deposited may be characterized by a dielectric constant below or about 2.8. The silicon-and-carbon-containing material as-deposited may be characterized by a hardness of greater than or about 1 Gpa. The silicon-and-carbon-containing material as-deposited may be characterized by a Young's modulus of greater than or about 5 Gpa. The silicon-and-carbon-containing material as-deposited may be characterized by a methyl incorporation greater than or about 3%. The silicon-and-carbon-containing material as-deposited may be characterized by a ratio of methyl incorporation to non-methyl carbon incorporation of greater than or about 1.2.

Some embodiments of the present technology may encompass methods of forming a silicon-and-carbon-containing material. The methods may include providing a deposition precursor into a processing region of a semiconductor processing chamber, wherein a substrate is housed within the processing region of the semiconductor processing chamber, and wherein the deposition precursor is characterized by Formula 1:

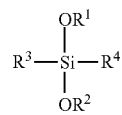

wherein in Formula 1 $R^1$ may include —$CH_3$ or —$CH_2CH_3$,
$R^2$ may include —$CH_3$ or —$CH_2CH_3$,
$R^3$ may include —$CH_3$, —$OCH_3$ or H, and
$R^4$ may include —$(CH_2)_nCH_3$, —$O(CH_2)_nCH_3$, —$CH=CH_2$, $CH_2$—$CH_2$—$(CH_2CH_3)_2$, —$CH_2$—$CH(CH_3)_2$. The method may include forming a plasma within the processing region of the deposition precursor. The plasma may be formed at a frequency above 27 MHz. The methods may include depositing a silicon-and-carbon-containing material on the substrate. The silicon-and-carbon-containing material as-deposited may be characterized by a dielectric constant below or about 3.0.

In some embodiments, the deposition precursor may be characterized by ratio of carbon to silicon of greater than or about 3. The deposition precursor may be characterized by ratio of oxygen to silicon of greater than or about 1.5. The silicon-and-carbon-containing material as-deposited may be characterized by a dielectric constant below or about 2.8. The silicon-and-carbon-containing material as-deposited may be characterized by a hardness of greater than or about 1 Gpa. The silicon-and-carbon-containing material as-deposited may be characterized by a Young's modulus of greater than or about 5 Gpa. The silicon-and-carbon-containing material as-deposited may be characterized by a methyl incorporation greater than or about 3%. The silicon-and-carbon-containing material as-deposited may be characterized by a ratio of methyl incorporation to non-methyl carbon incorporation of greater than or about 1.2.

Some embodiments of the present technology may encompass methods of forming a silicon-and-carbon-containing material. The methods may include flowing a silicon-and-carbon-and-oxygen-containing precursor into a processing region of a semiconductor processing chamber. A substrate may be housed within the processing region of the semiconductor processing chamber. The methods may include forming a plasma within the processing region of the silicon-and-carbon-and-oxygen-containing precursor. The plasma may be formed at a frequency above or about 27 MHz. The methods may include depositing a silicon-and-carbon-containing material on the substrate. The silicon-and-carbon-containing material as-deposited may be characterized by a dielectric constant below or about 2.9.

In some embodiments, the silicon-and-carbon-containing material as-deposited is characterized by a hardness of greater than or about 1 Gpa. The silicon-and-carbon-containing material as-deposited may be characterized by a Young's modulus of greater than or about 5 Gpa. The silicon-and-carbon-containing material as-deposited may be characterized by a methyl incorporation greater than or about 3%.

Such technology may provide numerous benefits over conventional systems and techniques. For example, utilizing higher frequency power may improve deposition characteristics. Additionally, reducing the low-k formation to a single-chamber process may reduce production costs, cost of ownership, and production queue times. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
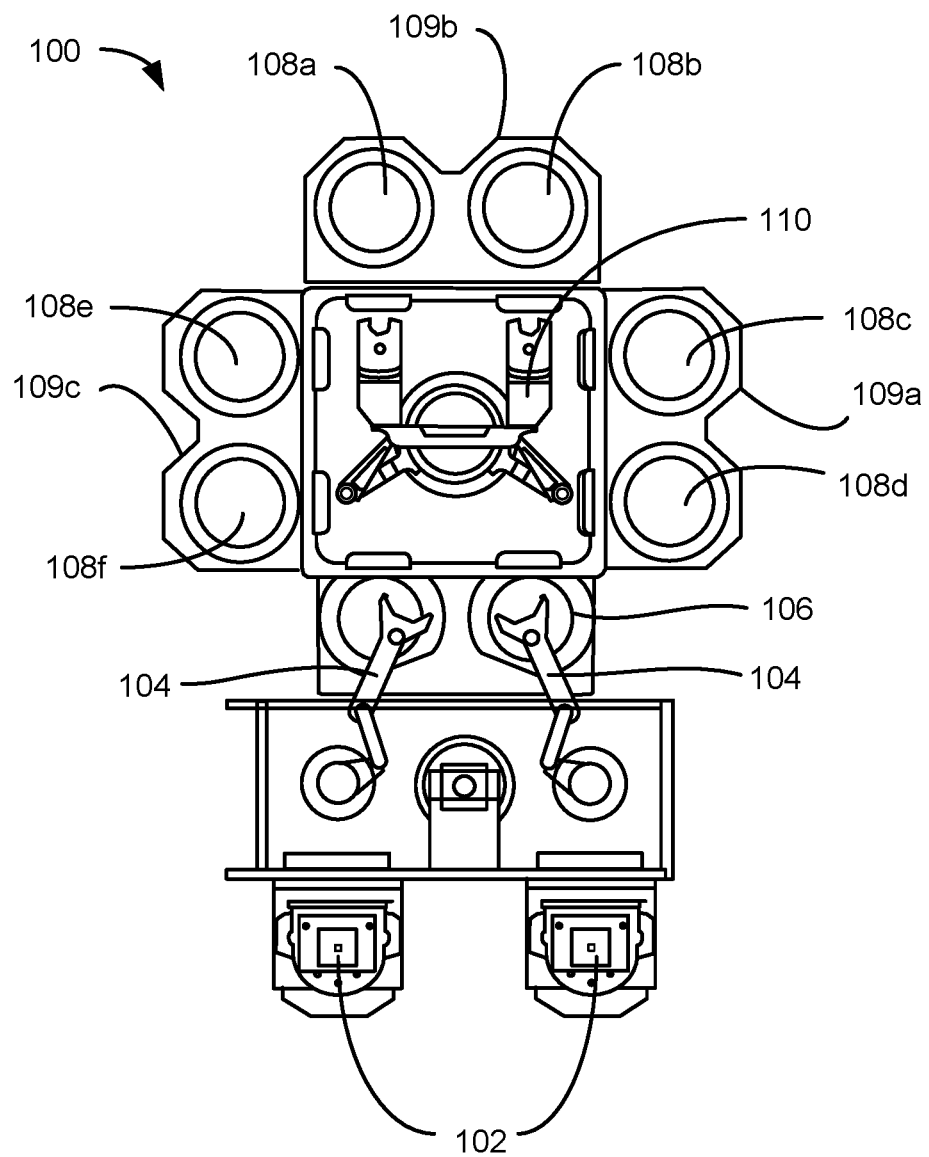
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, in memory development, such as DRAM, deposition of films may be performed to produce the cell structures. Conventional DRAM may include one or more low-k dielectric films that may be produced by performing a two-step operation. An initial film may be formed with a silicon precursor and a porogen, followed by a UV treatment to release the porogen. This process may be time-consuming and expensive, requiring separate chambers for the deposition and the UV treatment.

The present technology may overcome these issues by performing a deposition process utilizing high-frequency plasma in a single processing chamber. Much plasma processing is performed at about 13 MHz, which produces an amount of ion bombardment that may affect material properties. In one example, low-k films may be produced by incorporating carbon-containing materials within the film. When plasma at lower frequency is utilized, the ion bombardment on the substrate may cause the carbon to be removed, which may increase the dielectric constant of the film. Increasing to a high-frequency process, such as greater than or about 27 MHz, greater than or about 40 MHz, or more, may increase the plasma density, which may increase the radical generation relative to the ionic generation while also increasing the plasma density. This may lower ion bombardment, and may advantageously also increase the rate of deposition. The produced films may be characterized by lower dielectric constant values over conventional technologies, and may also retain useful hardness and Young's modulus characteristics.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
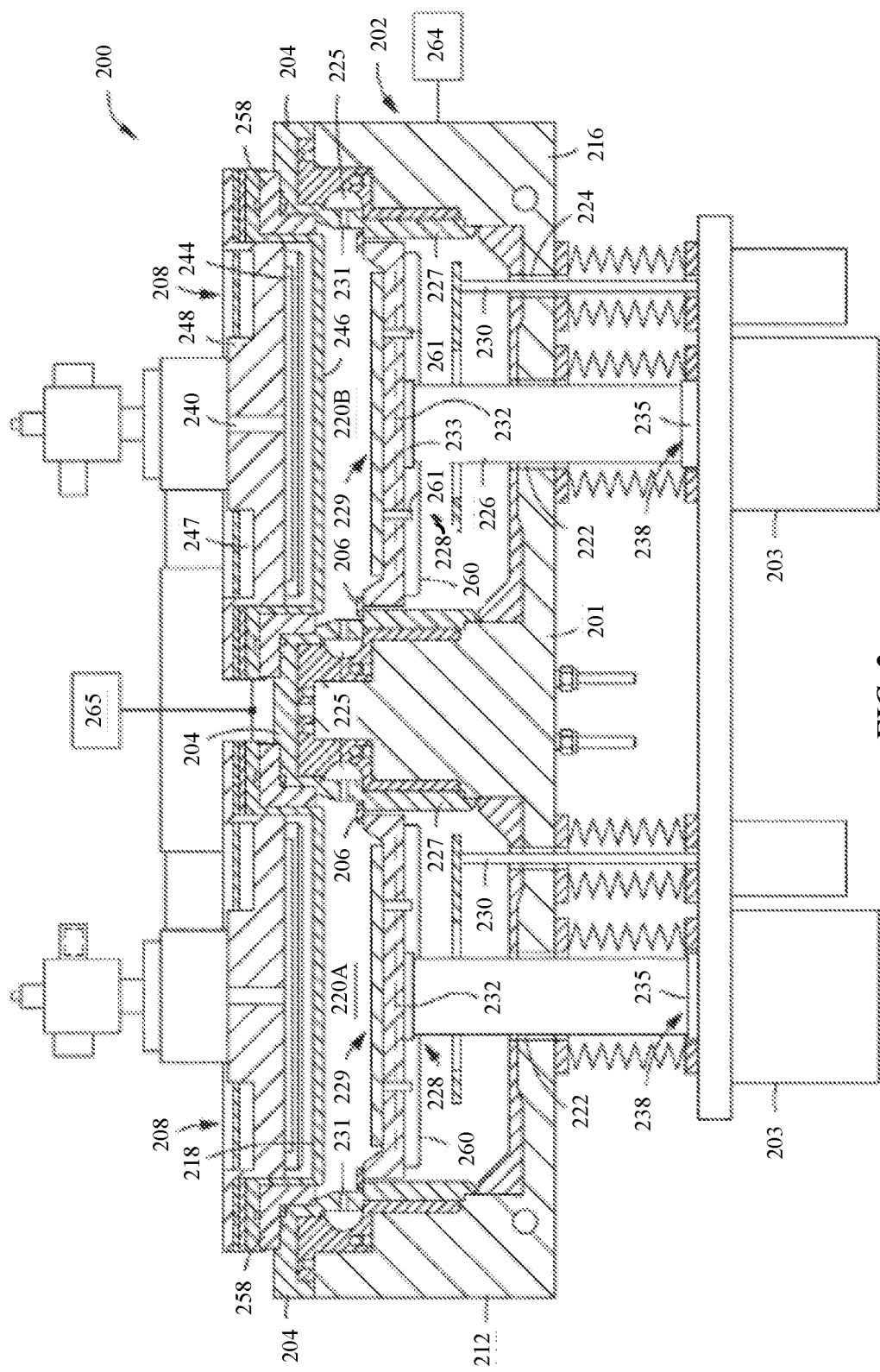
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
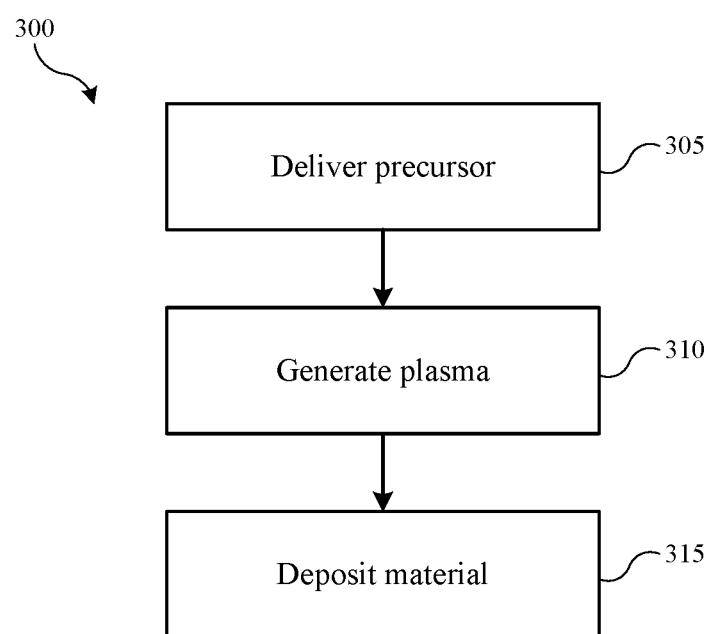
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology.

Method 300 may include a processing method that may include operations for forming a material film or other deposition operations at high frequency, such as producing DRAM memory or other materials, which may be formed at a higher rate of deposition, and which may be produced with lower dielectric constant relative to conventional processes. The method may include optional operations prior to initiation of method 300, or the method may include additional operations. For example, method 300 may include operations performed prior to the start of the method, including additional deposition, removal, or treatment operations. In some embodiments, method 300 may include flowing one or more precursors into a processing chamber at operation 305, which may deliver the precursor or precursors into a processing region of the chamber where a substrate may be housed, such as region 220, for example.

In some embodiments, the precursor may be or include a silicon-and-carbon-containing precursor for producing a low-k dielectric layer, such as silicon oxide. The precursors may or may not include delivery of additional precursors, such as carrier gases or one or more oxygen-containing precursors for depositing an oxide layer. In some embodiments, the deposition may utilize a single deposition precursor that includes silicon, carbon, and oxygen. Although a carrier gas, such as an inert precursor, may be delivered with the deposition precursor, additional precursors intended to react with the deposition precursor and produce deposition products may not be used. By limiting the deposition to a single precursor, more simplified deposition chambers may be used, as uniform mixing and delivery of multiple precursors may not be required.

Deposition precursors according to some embodiments of the present technology may include precursors having silicon and oxygen bonding, and may include linear branched precursors, cyclic precursors, or any number of additional precursors. In some embodiments the precursors may be characterized by certain ratios of carbon and/or oxygen to silicon. For example, in some embodiments a ratio of either carbon or oxygen to silicon may be greater than or about 1, and may be greater than or about 1.5, greater than or about 2, greater than or about 2.5, greater than or about 3, greater than or about 3.5, greater than or about 4, or more. By increasing the amount of carbon or oxygen relative to silicon, additional incorporation within the film of residual moieties or molecules may be increased. This may improve material properties, as well as lower a dielectric constant as will be described further below.

Although any number of precursors may be utilized, in some embodiments of the present technology, exemplary precursors may be characterized by the following general Formula 1:

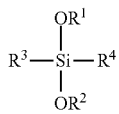

where $R^1$ may include —$CH_3$ or —$CH_2CH_3$,
$R^2$ may include —$CH_3$ or —$CH_2CH_3$,
$R^3$ may include —$CH_3$, —$OCH_3$ or H, and
$R^4$ may include —$(CH_2)_nCH_3$, —$O(CH_2)_nCH_3$, —$CH=CH_2$, —$CH_2$—$CH_2$—$(CH_2CH_3)_2$, —$CH_2$—$CH(CH_3)_2$.

Any number of precursors may be encompassed by this general formula or other formulae that may provide one or more characteristics for film formation, and may produce low-k silicon-and-carbon materials, such as carbon-doped silicon oxide, for example. Exemplary precursors that may act as single deposition precursors, or may be combined in some embodiments according to the present technology may include precursors according to any of the following structures or formulae:

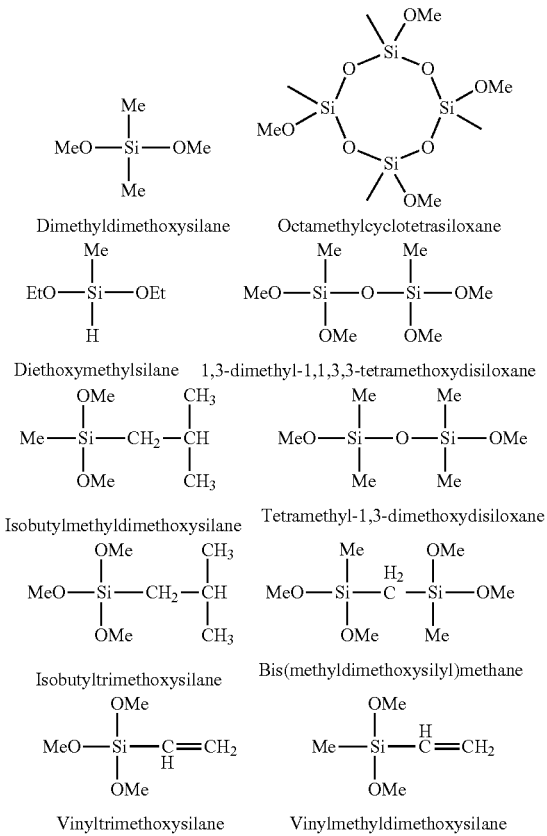

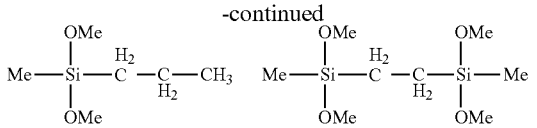

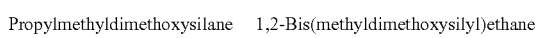

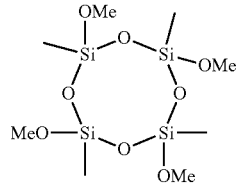

1,3,5,7-Tetramethyl-1,3,5,7-tetramethoxycyclotetrasiloxane

At operation 310, a plasma may be generated of the precursors within the processing region, such as by providing RF power to the faceplate to generate a plasma within processing region 220, although any other processing chamber capable of producing plasma may similarly be used. The plasma may be generated at any of the frequencies previously described, and may be generated at a frequency of greater than or about 15 MHz, and may be generated at greater than or about 20 MHz, greater than or about 27 MHz, greater than or about 40 MHz, or greater. By utilizing higher frequency plasma, a ratio of radical effluents to ions may be greater than or about 5, greater than or about 6, greater than or about 7, greater than or about 8, greater than or about 9, greater than or about 10, greater than or about 11, greater than or about 12, or greater, for any of the precursors delivered. This may limit the ion bombardment to the film being formed, which may facilitate maintaining a certain amount of carbon within the film, which may provide a lower dielectric constant.

The deposition may be performed at substrate or pedestal temperatures greater than or about 300° C., which may improve release of certain carbon-and-hydrogen materials from the film, as well as cross-linking of silicon and oxygen chains within the material network. As will be explained further below, while some carbon aspects may be beneficial to the film, others may be less beneficial to the material produced. Accordingly, by increasing the deposition temperature, film properties may be improved. Consequently, in some embodiments the deposition may occur at temperatures greater than or about 350° C., greater than or about 375° C., greater than or about 400° C., greater than or about 425° C., greater than or about 450° C., or higher.

Material formed in the plasma may be deposited on the substrate at operation 315, which may produce a silicon-and-carbon-containing material, and which may produce a silicon-and-carbon-and-oxygen-containing material, such as a carbon-doped silicon oxide. By utilizing a high frequency plasma, plasma density may be increased, which may increase a deposition rate of the material. For example, in some embodiments the deposition rate may exceed 900 Å/min, and may be deposited at a rate greater than or about 1,000 Å/min, greater than or about 1,200 Å/min, greater than or about 1,400 Å/min, greater than or about 1,600 Å/min, greater than or about 1,800 Å/min, greater than or about 2,000 Å/min, greater than or about 2,200 Å/min, greater than or about 2,500 Å/min, greater than or about 3,000 Å/min, greater than or about 3,500 Å/min, greater than or about 4,000 Å/min, or more. After deposition to a sufficient thickness, many conventional processes may then transfer the substrate to a second chamber to perform a treatment, such as a UV treatment or other post-deposition treatment. This may reduce throughput, and may increase production costs by requiring an additional chamber or tool to perform the treatment. The present technology, however, may produce materials, including carbon-doped silicon oxide, which may be characterized by sufficient material properties as deposited, and without additional treatments. Although embodiments of the present technology may encompass additional treatments subsequent deposition, the as-deposited characteristics of the film may include a range of improvements over conventional technology.

As explained above, conventional technologies operating at lower plasma frequencies may cause an amount of ion bombardment that may otherwise release carbon-containing materials from the deposited materials, which may increase the dielectric constant of the film. By utilizing higher plasma frequencies, along with precursors according to the present technology, low-k dielectric materials may be produced that may be characterized by a dielectric constant of less than or about 3.00, and may be less than or about 2.95, less than or about 2.90, less than or about 2.85, less than or about 2.80, less than or about 2.79, less than or about 2.78, less than or about 2.77, less than or about 2.76, less than or about 2.75, less than or about 2.74, less than or about 2.73, less than or about 2.72, less than or about 2.71, less than or about 2.70, or less.

Dielectric constant may be related to material properties of the film, where the lower the dielectric constant, the lower the Young's modulus and/or hardness of the film produced. By producing films according to some embodiments of the present technology, hardness and modulus may be maintained higher than would otherwise occur were conventional technologies capable of producing films with corresponding as-deposited dielectric constant values. For example, in some embodiments, the present technology may produce materials characterized by a Young's modulus of greater than or about 5.0 Gpa, and may be characterized by a Young's modulus of greater than or about 5.5 Gpa, greater than or about 6.0 Gpa, greater than or about 6.5 Gpa, greater than or about 7.0 Gpa, greater than or about 7.5 Gpa, greater than or about 8.0 Gpa, greater than or about 8.5 Gpa, greater than or about 9.0 Gpa, greater than or about 9.5 Gpa, greater than or about 10.0 Gpa, or higher. Similarly, the present technology may produce materials characterized by a hardness of greater than or about 0.9 Gpa, and may be characterized by a hardness of greater than or about 1.0 Gpa, greater than or about 1.1 Gpa, greater than or about 1.2 Gpa, greater than or about 1.3 Gpa, greater than or about 1.4 Gpa, greater than or about 1.5 Gpa, greater than or about 1.6 Gpa, greater than or about 1.7 Gpa, greater than or about 1.8 Gpa, greater than or about 1.9 Gpa, greater than or about 2.0 Gpa, or higher. Consequently, the present technology may produce films characterized by a lower dielectric constant, while maintaining higher modulus and hardness characteristics of the materials.

The material characteristics produced by embodiments of the present technology may be related to an amount of methyl groups incorporated into the film, as well as an amount of non-methyl carbon incorporated within the film, such as $CH_2$ or CH, bonded within the film. The processing may release an amount of these materials, which may provide an amount of porosity to the film, while retaining an amount of methyl incorporation, which may facilitate lowering a dielectric constant of the film produced, whereas higher amounts of non-methyl carbon retained within the film may increase the dielectric constant above the values noted above. For example, in some embodiments, as-deposited materials produced according to the present technology may be characterized by a methyl or $CH_3$ percentage incorporated or retained within the film of greater than or about 2%, and may be characterized by a methyl incorporation within the film of greater than or about 2.5%, greater than or about 2.6%, greater than or about 2.7%, greater than or about 2.8%, greater than or about 2.9%, greater than or about 3.0%, greater than or about 3.1%, greater than or about 3.2%, greater than or about 3.3%, greater than or about 3.4%, greater than or about 3.5%, greater than or about 3.6%, greater than or about 3.7%, greater than or about 3.8%, greater than or about 3.9%, greater than or about 4.0%, or higher.

Additionally, a percentage of $CH_2$, and/or CH, and/or SiCSi may be less than or about 3.0% in the as-deposited materials, and may be less than or about 2.9%, less than or about 2.8%, less than or about 2.7%, less than or about 2.6%, less than or about 2.5%, less than or about 2.4%, less than or about 2.3%, less than or about 2.2%, less than or about 2.1%, less than or about 2.0%, less than or about 1.9%, less than or about 1.8%, or less. Accordingly, the as-deposited materials may be characterized by a ratio of methyl incorporation to non-methyl carbon incorporation of between about 1.0 and about 2.0, which may be greater than or about 1.1, greater than or about 1.2, greater than or about 1.3, greater than or about 1.4, greater than or about 1.5, greater than or about 1.6, greater than or about 1.7, greater than or about 1.8, greater than or about 1.9, or higher. By utilizing higher frequency plasma with other processing characteristics according to embodiments of the present technology, low-k dielectric materials may be produced, which may be characterized by increased hardness and Young's modulus values, among other material properties.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a silicon-and-carbon-containing material, the method comprising:
    flowing a silicon-and-carbon-containing precursor into a processing region of a semiconductor processing chamber, wherein a substrate is housed within the processing region of the semiconductor processing chamber;
    forming a plasma within the processing region of the silicon-and-carbon-containing precursor, wherein the plasma is formed at a frequency above 15 MHz; and
    depositing a silicon-and-carbon-containing material on the substrate, wherein the silicon-and-carbon-containing material as-deposited is characterized by a dielectric constant below or about 3.0, and wherein the silicon-and-carbon-containing material as-deposited is characterized by a methyl incorporation within the silicon-and-carbon-containing material greater than or about 3%.

2. The method of forming a silicon-and-carbon-containing material of claim 1, wherein the silicon-and-carbon-containing precursor further comprises oxygen.

3. The method of forming a silicon-and-carbon-containing material of claim 2, wherein the silicon-and-carbon-containing precursor is characterized by a carbon-to-silicon ratio greater than 1.

4. The method of forming a silicon-and-carbon-containing material of claim 1, wherein the plasma is formed at a frequency above or about 27 MHz.

5. The method of forming a silicon-and-carbon-containing material of claim 1, wherein the silicon-and-carbon-containing material as-deposited is characterized by a dielectric constant below or about 2.8.

6. The method of forming a silicon-and-carbon-containing material of claim 1, wherein the silicon-and-carbon-containing material as-deposited is characterized by a hardness of greater than or about 1 Gpa.

7. The method of forming a silicon-and-carbon-containing material of claim 1, wherein the silicon-and-carbon-containing material as-deposited is characterized by a Young's modulus of greater than or about 5 Gpa.

8. The method of forming a silicon-and-carbon-containing material of claim 1, wherein the silicon-and-carbon-containing material as-deposited is characterized by a ratio of methyl incorporation to non-methyl carbon incorporation of greater than or about 1.2.

9. The method of forming a silicon-and-carbon-containing material of claim 1, wherein the silicon-and-carbon-containing material as-deposited is characterized by a $CH_2$ incorporation within the silicon-and-carbon-containing material less than or about 2.5%.

10. A method of forming a silicon-and-carbon-containing material, the method comprising:
    flowing a silicon-and-carbon-and-oxygen-containing precursor into a processing region of a semiconductor processing chamber, wherein a substrate is housed within the processing region of the semiconductor processing chamber;
    forming a plasma within the processing region of the silicon-and-carbon-and-oxygen-containing precursor, wherein the plasma is formed at a frequency above or about 27 MHz; and
    depositing a silicon-and-carbon-containing material on the substrate, wherein the silicon-and-carbon-containing material as-deposited is characterized by a dielectric constant below or about 2.9, and wherein the silicon-and-carbon-containing material as-deposited is characterized by a methyl incorporation within the silicon-and-carbon-containing material greater than or about 3%.

11. The method of forming a silicon-and-carbon-containing material of claim 10, wherein the silicon-and-carbon-containing material as-deposited is characterized by a hardness of greater than or about 1 Gpa, and wherein the silicon-and-carbon-containing material as-deposited is characterized by a Young's modulus of greater than or about 5 Gpa.

12. The method of forming a silicon-and-carbon-containing material of claim 10, wherein the silicon-and-carbon-containing material as-deposited is characterized by a $CH_2$ incorporation within the silicon-and-carbon-containing material less than or about 2.5%.

* * * * *